US012563985B2

(12) United States Patent
Yamada et al.

(10) Patent No.: US 12,563,985 B2
(45) Date of Patent: Feb. 24, 2026

(54) SEMICONDUCTOR DEVICE MANUFACTURING METHOD WITH SLIP SUPPRESSING IMPURITY REGION

(71) Applicant: FUJI ELECTRIC CO., LTD., Kanagawa (JP)

(72) Inventors: Takane Yamada, Matsumoto (JP); Masayuki Momose, Matsumoto (JP); Naoki Kuneshita, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 250 days.

(21) Appl. No.: 17/969,710

(22) Filed: Oct. 20, 2022

(65) Prior Publication Data

US 2023/0187221 A1     Jun. 15, 2023

(30) Foreign Application Priority Data

Dec. 14, 2021     (JP) .................................. 2021-202710

(51) Int. Cl.
H01L 21/322        (2006.01)
H01L 23/544        (2006.01)

(52) U.S. Cl.
CPC ........ H01L 21/3225 (2013.01); H01L 23/544 (2013.01); *H01L 2223/54493* (2013.01)

(58) Field of Classification Search
CPC ................................................. H01L 21/3225
See application file for complete search history.

(56) References Cited

U.S. PATENT DOCUMENTS 5,825,065 A * 10/1998 Corsi ................... H01L 29/086
                                                                      257/337
6,093,644 A * 7/2000 Inaba ................ H01L 21/67306
                                                                      206/832
(Continued)

FOREIGN PATENT DOCUMENTS

CN          106229813 A * 12/2016 ............. H01S 5/223
JP          H0562867 A      3/1993
(Continued)

OTHER PUBLICATIONS

Office Action issued for counterpart Japanese Application No. 2021-202710, transmitted from the Japanese Patent Office on Aug. 26, 2025 (drafted on Aug. 18, 2025).

*Primary Examiner* — Norman D Richards
*Assistant Examiner* — Sean Ayers Winters

(57)          ABSTRACT

Provided is a semiconductor device manufacturing method including a process of annealing a semiconductor wafer in a state in which a supported portion on a lower surface of the semiconductor wafer is supported by using a supporting portion, wherein the supported portion includes one or a plurality of supporting portions and the supporting portion includes one or a plurality of supporting portions, the method comprising: forming impurity regions including a first impurity in a region which is overlapped with the supported portion in a top view and which is apart from an edge of the semiconductor wafer; annealing the semiconductor wafer in a state in which the lower surface of the semiconductor wafer is supported by the supporting portion; and removing the impurity regions by removing a region including the lower surface of the semiconductor wafer.

21 Claims, 13 Drawing Sheets

(56) References Cited

U.S. PATENT DOCUMENTS

| | | | | |
|---|---|---|---|---|
| 2003/0215985 | A1* | 11/2003 | Kouno | H01L 21/78 |
| | | | | 257/E29.198 |
| 2004/0056314 | A1* | 3/2004 | Ohguro | H01L 29/06 |
| | | | | 257/374 |
| 2005/0247259 | A1* | 11/2005 | Yoon | H01L 21/3225 |
| | | | | 257/E21.321 |
| 2017/0170028 | A1* | 6/2017 | Schustereder | H01L 21/02532 |

FOREIGN PATENT DOCUMENTS

| | | | |
|---|---|---|---|
| JP | H09190954 | A | 7/1997 |
| JP | 2005064524 | A | 3/2005 |

* cited by examiner

SEMICONDUCTOR DEVICE MANUFACTURING METHOD WITH SLIP SUPPRESSING IMPURITY REGION

BACKGROUND

1. Technical Field

The present invention relates to a manufacturing method of a semiconductor device.

2. Related Art

Conventionally, forming a semiconductor device by using a semiconductor wafer made of silicon or the like is known (For example, see Patent Document 1-3).

Patent Document 1: Japanese Patent Application Publication No. H5-62867

Patent Document 2: Japanese Patent Application Publication No. H9-190954

Patent Document 3: Japanese Patent Application Publication No. 2005-64524

DESCRIPTION OF EXEMPLARY EMBODIMENTS

Hereinafter, the invention will be described through embodiments of the invention, but the following embodiments do not limit the invention according to claims. In addition, not all the combinations of features described in the embodiments are essential to the solution of the invention.

In the present specification, one side in a direction parallel to a depth direction of a semiconductor wafer is referred to as an "upper" side, and the other side is referred to as a "lower" side. One surface of two principal surfaces of a wafer, a substrate, a layer or another member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, the orthogonal axes which are parallel to an upper surface and a lower surface of a semiconductor wafer are referred to as an X axis and a Y axis. In addition, an axis which is perpendicular to the upper surface and the lower surface of the semiconductor wafer is referred to as a Z axis. In the present specification, the direction of the Z axis may be referred to as a depth direction. In addition, in the present specification, a direction parallel to the upper surface and the lower surface of the semiconductor wafer, including the X axis and the Y axis, may be referred to as a horizontal direction.

In addition, a region from the center of the depth direction of the semiconductor wafer to the upper surface thereof may be referred to as an upper surface side of the semiconductor wafer. Similarly, a region from the center of the depth direction of the semiconductor wafer to the lower surface thereof may be referred to as a lower surface side of the semiconductor wafer.

In the present specification, a case where a term such as "same" or "equal" is mentioned may include a case where an error due to a variation in manufacturing or the like is included. The error is, for example, within 10%.

When charged particle such as an ion or electron is implanted into the semiconductor wafer with predetermined acceleration energy, the particle has a predetermined distribution in the depth direction. In the present specification, a position of a peak of the distribution may be referred to as a particle implantation position or implantation depth or the like.

Figure 1:
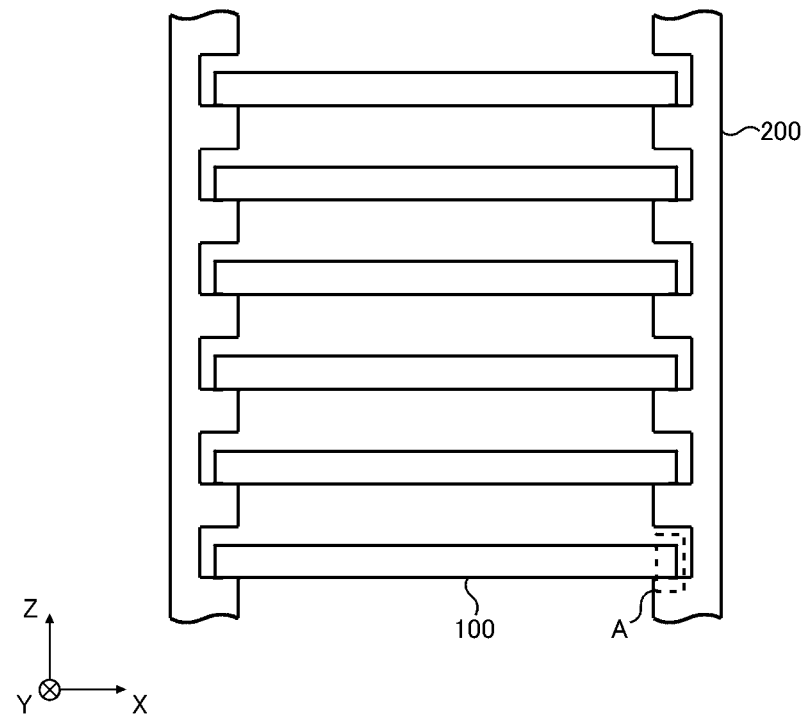
FIG. 1 shows a process of annealing a semiconductor wafer 100.

FIG. 1 is a diagram showing an example of a manufacturing step of a semiconductor device. The semiconductor device includes a semiconductor element such as a transistor or diode. The semiconductor device is formed on a semiconductor wafer 100. The semiconductor wafer 100 is formed of a semiconductor material such as silicon, silicon carbide or gallium nitride. The semiconductor wafer 100 has a disc-shape in a top view in a Z axis direction, for example. In FIG. 1, the semiconductor wafer 100 has a rectangular shape in a cross-sectional view in a Y axis direction, for example. In FIG. 1, an end portion of the semiconductor wafer 100 is not chamfered; but the end portion of the semiconductor wafer 100 may be chamfered. A plurality of semiconductor devices (semiconductor chips) may be formed on the semiconductor wafer 100. By dicing and singulating the semiconductor wafer 100, the plurality of semiconductor devices can be manufactured.

FIG. 1 shows a process of annealing a semiconductor wafer 100. For example, in the manufacturing step of the semiconductor device, the semiconductor wafer 100 may be annealed at a predetermined temperature for a predetermined time after implanting an impurity into the semiconductor wafer 100. By annealing the semiconductor wafer 100, the impurity can be spread and also activated as a donor or an acceptor. When annealing the semiconductor wafer 100, a carrying boat 200 in which the semiconductor wafer 100 is placed is put into an annealing furnace. In the carrying boat 200, a plurality of semiconductor wafers 100 may be placed.

Figure 2:
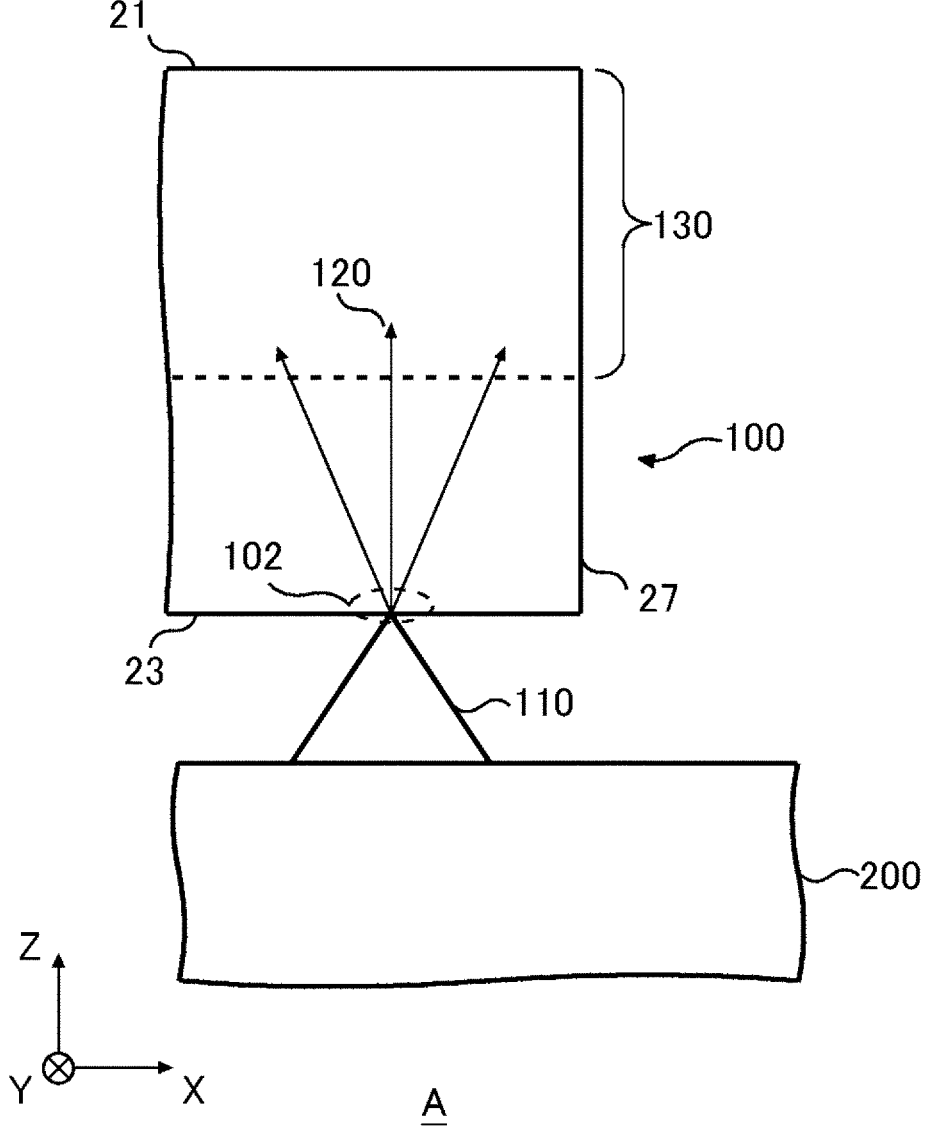
FIG. 2 is an enlarged view of the region A in FIG. 1.

FIG. 2 is an enlarged view of the region A in FIG. 1. The region A includes a portion in which the semiconductor wafer 100 and the carrying boat 200 are contacting each other. The semiconductor wafer 100 has an upper surface 21, a lower surface 23 and an edge 27. The upper surface 21 and the lower surface 23 are two principal surfaces of the semiconductor wafer 100. That is, the upper surface 21 and the lower surface 23 are the two surfaces having the largest areas in the semiconductor wafer 100. The edge 27 is a side surface between the upper surface 21 and the lower surface 23.

The lower surface 23 of the semiconductor wafer 100 of the present example is partially supported by the supporting portion 110 of the carrying boat 200. A portion of the lower surface 23 of the semiconductor wafer 100 which is in contact with the supporting portion 110 of the carrying boat 200, is referred to as a supported portion 102. In the example of FIG. 2, the supporting portion 110 is conical, and the supporting portion 110 and the supported portion 102 are in contact with each other by a point. In another example, the supporting portion 110 and the supported portion 102 may be in contact with each other by a line, or may be in contact with each other by a surface.

In a state in which the lower surface 23 of the semiconductor wafer 100 is supported, stress is generated nearby the supported portion 102 due to the own weight of the semiconductor wafer 100. If the semiconductor wafer 100 is annealed in this state, a defect may be generated in the supported portion 102. In the present specification, the defect is referred to as a slip 120. The defect is a distortion of crystal structure in the semiconductor wafer 100 (that is, a crystal defect). The slip 120 proceeds, as represented with an arrow in FIG. 2, in a direction toward the upper surface 21 from the supported portion 102.

The semiconductor wafer 100 includes an element region 130 in which a semiconductor element is formed. The element region 130 in the present example is contacting the upper surface 21 of the semiconductor wafer 100. The element region 130 is a region in which the semiconductor element remains as a semiconductor device. The regions other than the element region 130 in the semiconductor wafer 100 are removed in the manufacturing step. For example, the semiconductor wafer 100 is formed to be thicker than a semiconductor substrate of a semiconductor device to be finally manufactured, in order to prevent damage or the like in the manufacturing step. In the final stage of the manufacturing step, the thickness of the semiconductor wafer 100 is adjusted according to a breakdown voltage or the like of the semiconductor device. For example, by grinding the lower surface 23 side of the semiconductor wafer 100, the thickness of the semiconductor wafer 100 is adjusted. In FIG. 1 and FIG. 2, the semiconductor wafer 100 before adjusting the thickness is shown.

If the above-described slip 120 reaches the element region 130, it affects the characteristic of the semiconductor element. For example, effects such as an increase of leakage current of the semiconductor element, and a decrease of the breakdown voltage may occur. As the annealing temperature becomes higher, the slip 120 is more likely to be generated and to proceed. In particular, if the annealing temperature becomes high to be equal to or greater than 1000° C., the generation of the slip 120 becomes significant, and the slip 120 is likely to reach the element region 130.

On the other hand, in the manufacturing step of the semiconductor device, a case where the semiconductor wafer 100 is annealed at a high temperature is considered. For example, the annealing temperature increases when the impurity which is implanted into the element region 130 of the semiconductor wafer 100 is spread to a position which is apart from the implantation position. In such a case, the slip 120 is likely to reach the element region 130. The generation and development of the slip 120 can be suppressed by annealing at a low temperature, but in such a case the annealing time becomes longer if the impurity is to be sufficiently spread and thus a throughput of the manufacturing step decreases.

In addition, if the diameter of the semiconductor wafer 100 is equal to or greater than 300 mm, the generation of the slip 120 becomes significant, and the slip 120 is likely to reach the element region 130. It can be considered to occur because the own weight of the semiconductor wafer 100 is increased and the stress nearby the supported portion 102 is increased.

In addition, if an oxygen concentration originally included in the semiconductor wafer 100 is equal to or less than $8\times0^{17}/cm^3$, the generation of the slip 120 becomes significant, and the slip 120 is likely to reach the element region 130. This is considered to be caused because the slip 120 becomes likely to proceed due to the decrease of the oxygen concentration.

Figure 3:
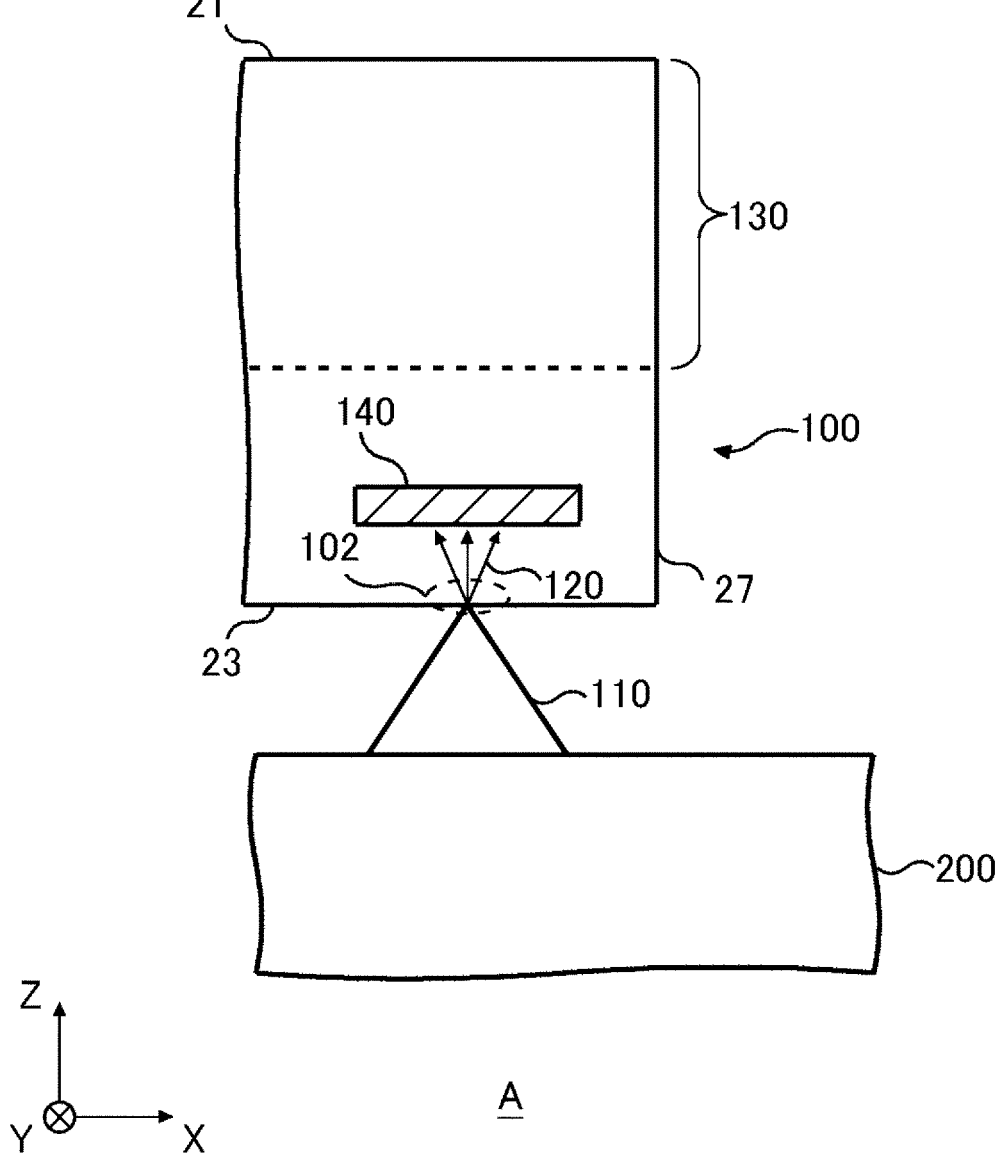
FIG. 3 illustrates one embodiment of the present invention.

FIG. 3 illustrates one embodiment of the present invention. In the present example, before a process in which the semiconductor wafer 100 is annealed at a high temperature (for example, equal to or greater than 1000° C.), an impurity region 140 is formed in advance including a first impurity in the semiconductor wafer 100. In the present specification, an impurity which forms the impurity region 140 is referred to as a first impurity. The impurity region 140 is positioned at a lower surface 23 side of the semiconductor wafer 100. The lower surface 23 side refers to a region between the center in a depth direction of the semiconductor wafer 100 and the lower surface 23. The impurity region 140 is a region where an atomic concentration of the first impurity per unit volume (atoms/cm³) is locally higher than the other regions. In the present specification, an atomic concentration of the impurity per unit volume may be simply referred to as an impurity concentration (/cm³). The impurity concentration can be measured with a well-known method such as the SIMS method (Secondary Ion Mass Spectrometry), for example.

The development of slip 120 which has reached from the lower surface 23 to the impurity region 140 is suppressed by the first impurity included in the impurity region 140. It is considered that, for example, if the slip 120 which has developed within the silicon crystal contacts the first impurity, the slip cannot bypass the first impurity and thus the development of the slip 120 towards the upper surface 21 side is suppressed. In this way, the impurity region 140 suppresses the development of the slip 120 from the lower surface 23 which is to be closer to the upper surface 21 side than the impurity region 140.

The first impurity included with a high concentration in the impurity region 140 is oxygen, for example. Note that the first impurity is not limited to oxygen. As the first impurity, an element which can suppress or inhibit the development of the slip 120 may be used. The first impurity may be nitrogen, may be hydrogen, may be carbon, or may be another element. The first impurity is an element different from the semiconductor material which forms the semiconductor wafer.

The entire impurity region 140 is arranged closer to the lower surface 23 side than the element region 130 side. In this way, the reaching of the slip 120 to the element region 130 can be prevented. In addition, by removing the region which is arranged closer to the lower surface 23 side than the element region 130 side, the impurity region 140 which is unnecessary can be removed.

The impurity region 140 is arranged to be overlapped with at least the supported portion 102 in an X-Y plane which is parallel to the lower surface 23 (that is, in a top view). The impurity region 140 is preferred to be arranged to cover the entire supported portion 102. In addition, the impurity region 140 is arranged in a region apart from the edge 27 of the semiconductor wafer 100. A range of the impurity region 140 on the X-Y plane may refer to a region having an impurity concentration equal to or greater than half of a peak value of an impurity concentration in the impurity region 140, may refer to a region having an impurity concentration equal to or greater than 10% of the peak value, or may refer to a region having an impurity concentration equal to or greater than 1% of the peak value. When the plurality of supported portions 102 are supported by the plurality of supporting portions 110, the impurity region 140 is provided to be overlapped with the plurality of supported portions 102. The impurity region 140 may be arranged in a discrete manner on the X-Y plane for each of the supported portions 102, or one impurity region 140 sequentially provided on the X-Y plane may cover the plurality of supported portions 102.

Because a region in which the impurity region 140 is not formed is provided by arranging the impurity region 140 in a region apart from the edge 27, a total amount of the first impurity included in the semiconductor wafer 100 can be reduced. In this way, warpage of the semiconductor wafer 100 in a manufacturing step of the semiconductor device can be prevented. For example, if the entire surface of the semiconductor wafer 100 is annealed by implanting oxygen, the semiconductor wafer 100 may be warped due to precipitation of the oxygen during the annealing. On the other hand, by providing the impurity region 140 locally, warpage of the semiconductor wafer 100 in the manufacturing step of the semiconductor device can be prevented. A distance between the edge 27 and the impurity region 140 may be equal to or greater than 10 mm, may be equal to or greater than 20 mm, or may be equal to or greater than 30 mm.

In addition, by providing the impurity region 140 for each of the supported portions 102 in a discrete manner, an area of the impurity region 140 on the X-Y plane can be further reduced to further reduce the total amount of the first impurity. The area in which the impurity region 140 is provided on the X-Y plane may be equal to or less than half of, may be equal to or less than ¼ of, or may be equal to or less than ¹⁄₁₀ of an area of the lower surface 23 of the semiconductor wafer 100.

Figure 4:
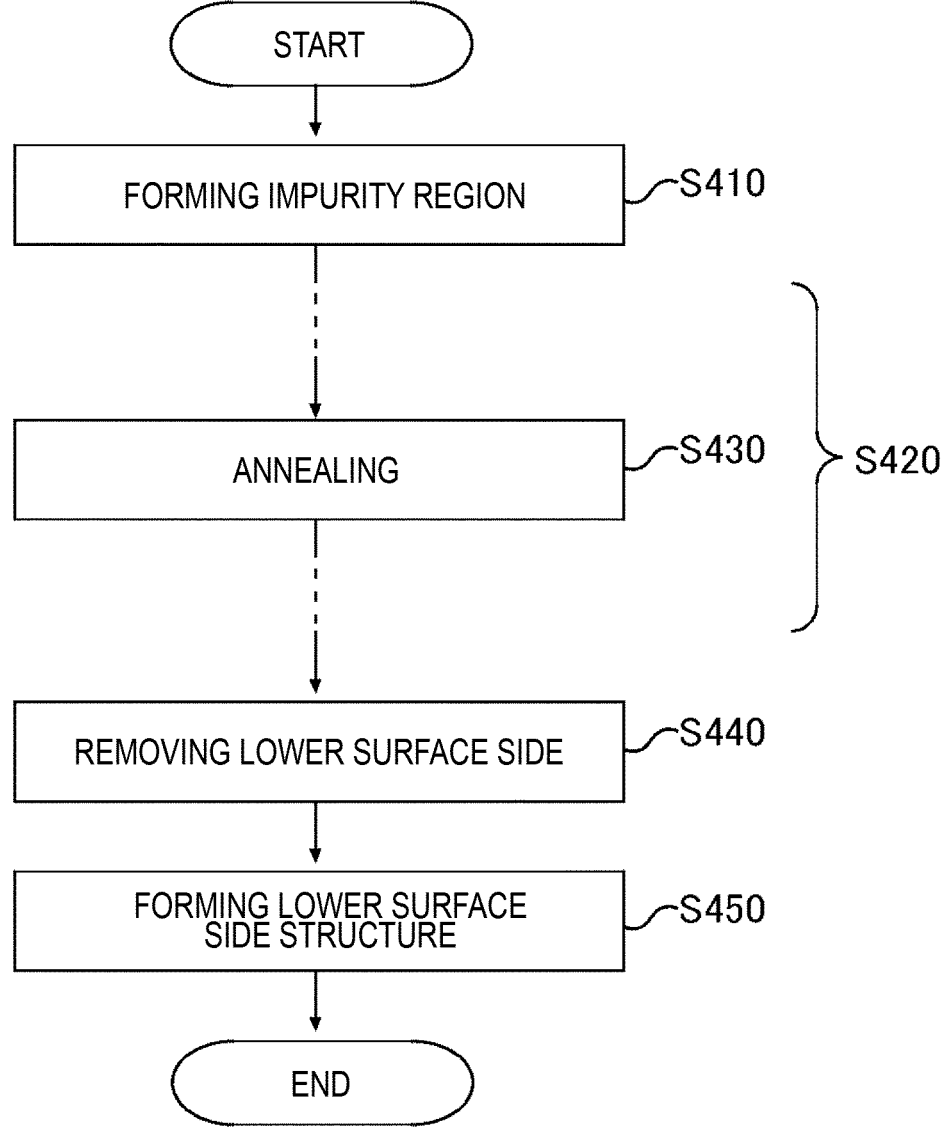
FIG. 4 is a flowchart showing an example of a manufacturing method of a semiconductor device.

FIG. 4 is a flowchart showing an example of a manufacturing method of a semiconductor device. The manufacturing method of the present example includes a region forming step S410, an annealing step S430 and a removing step S440. The manufacturing method may further include an upper surface side structure forming step S420 and a lower surface side structure forming step S450. The annealing step S430 of the present example is included in the upper surface side structure forming step S420.

Figure 5:
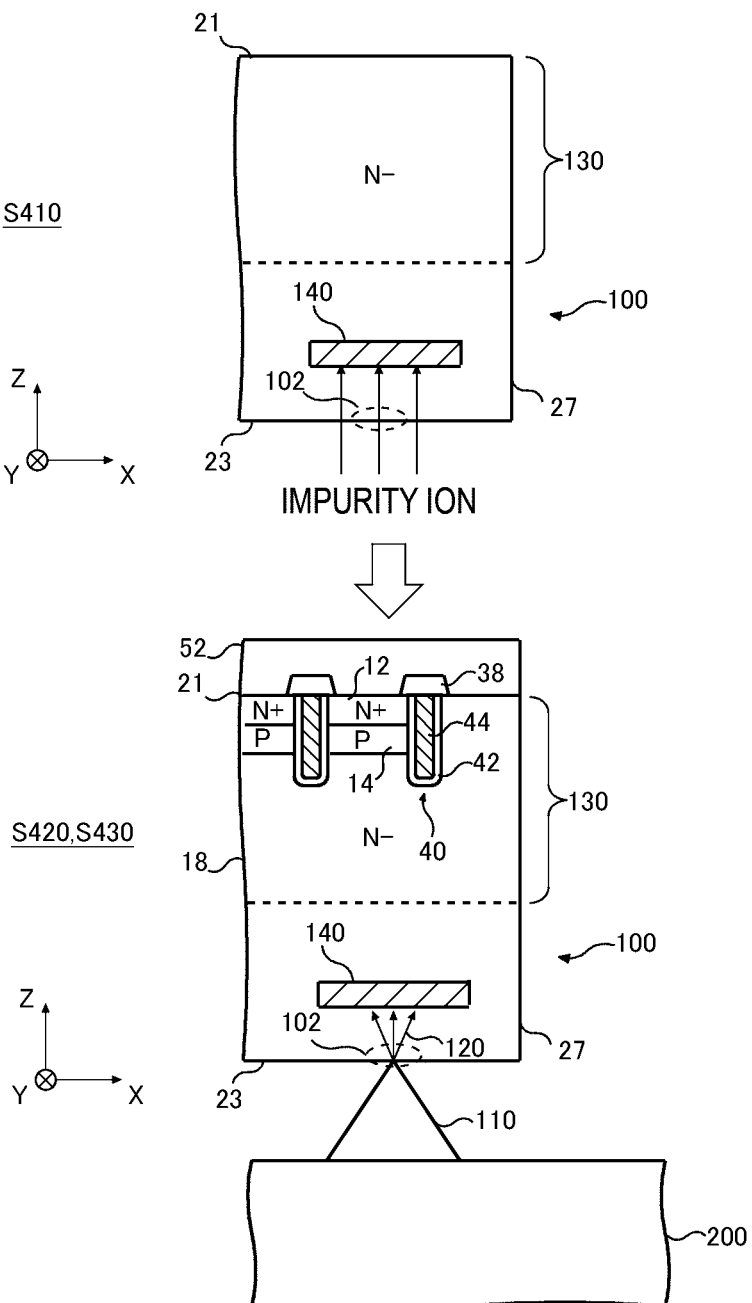
FIG. 5 illustrates a region forming step S410, an upper surface side structure forming step S420, and an annealing step S430.

FIG. 5 illustrates a region forming step S410, an upper surface side structure forming step S420, and an annealing step S430. A description of each step in FIG. 5 and the like shows a structure nearby the region A. The semiconductor wafer 100 of the present example is an N− type wafer. That is, a donor such as phosphorous is approximately uniformly distributed on the entire semiconductor wafer 100 immediately after a cut out from an ingot. In the present specification, a donor which is approximately uniformly distributed on the entire initial semiconductor wafer 100 may be referred to as a bulk donor.

In the region forming step S410, an impurity region 140 is formed on the lower surface 23 side of the semiconductor wafer 100. In the present example, the impurity region 140 is formed by implanting an ion of a first impurity such as an oxygen ion from the lower surface 23 of the semiconductor wafer 100. The impurity region 140 is a region which is overlapped with the supported portion 102 in a top view, and which is apart from the edge 27 of the semiconductor wafer 100. The ion of the first impurity is locally implanted into the lower surface 23. The impurity region 140 is formed to be overlapped with the entire supported portion 102 in a predetermined depth position from the lower surface 23. The impurity region 140 may be formed to be exposed to the lower surface 23 of the semiconductor wafer 100. A position on the Z axis in which the impurity region 140 is formed can be adjusted by acceleration energy of the impurity ion.

Subsequently, in the upper surface side structure forming step S420, at least a partial structure (may be referred to as an upper surface side structure) of the semiconductor element is formed closer to an upper surface 21 side than the impurity region 140. The semiconductor element of the present example is a trench gate type transistor. The upper surface side structure of the present example includes an emitter region 12, a base region 14, and a gate trench 40. In FIG. 5, the upper surface side structure is schematically shown. The emitter region 12 is an N+ type region provided to contact the upper surface 21 of the semiconductor wafer. The base region 14 is a P type region provided below the emitter region 12. An N− type drift region 18 is provided below the base region 14. An impurity concentration of the drift region 18 may be approximately the same as a concentration of the bulk donor. That is, the drift region 18 may be a region remaining without having the regions such as the emitter region 12 and the base region 14 formed thereon.

The gate trench 40 is provided from the upper surface 21 of the semiconductor wafer 100 to reach the drift region 18. The gate trench 40 includes a gate electrode 44 and a gate insulating film 42. The gate electrode 44 is formed of a conductive material such as polysilicon doped with an impurity. The gate insulating film 42 is provided between the gate electrode 44 and the semiconductor wafer 100 to electrically insulate the two. The gate insulating film 42 is an oxide film, for example. The emitter region 12 and the base region 14 are contacting a side surface of the gate trench 40. If a predetermined gate voltage is applied to the gate electrode 44, the base region 14 at a boundary with the gate trench 40 is inverted into the N type to form a channel. In this way, current flows between the emitter region 12 and the drift region 18. That is, the transistor becomes ON state.

The upper surface side structure may include an interlayer dielectric film 38 and an emitter electrode 52. The emitter electrode 52 is an electrode including a metal such as aluminum. The emitter electrode 52 is connected to the emitter region 12. The interlayer dielectric film 38 electrically insulates the gate electrode 44 and the emitter electrode 52 from each other. The interlayer dielectric film 38 may be provided on the upper surface 21 of the semiconductor wafer 100 to cover the gate trench 40.

The emitter region 12 and the base region 14 may be formed by implanting an impurity into the semiconductor wafer 100 and performing an annealing process. The annealing process may correspond to the annealing step S430. In the annealing process, the semiconductor wafer 100 is annealed in a state in which the supported portion 102 on the lower surface 23 of the semiconductor wafer 100 is supported by using the supporting portion 110 of the carrying boat 200.

As described above, in the annealing step S430, the slip 120 may be generated on the lower surface 23 of the semiconductor wafer 100. In the present example, even if the slip 120 is generated, the slip 120 can be suppressed from being developed by the impurity region 140. Thus, the slip 120 to the element region 130 can be suppressed from being developed.

Figure 6:
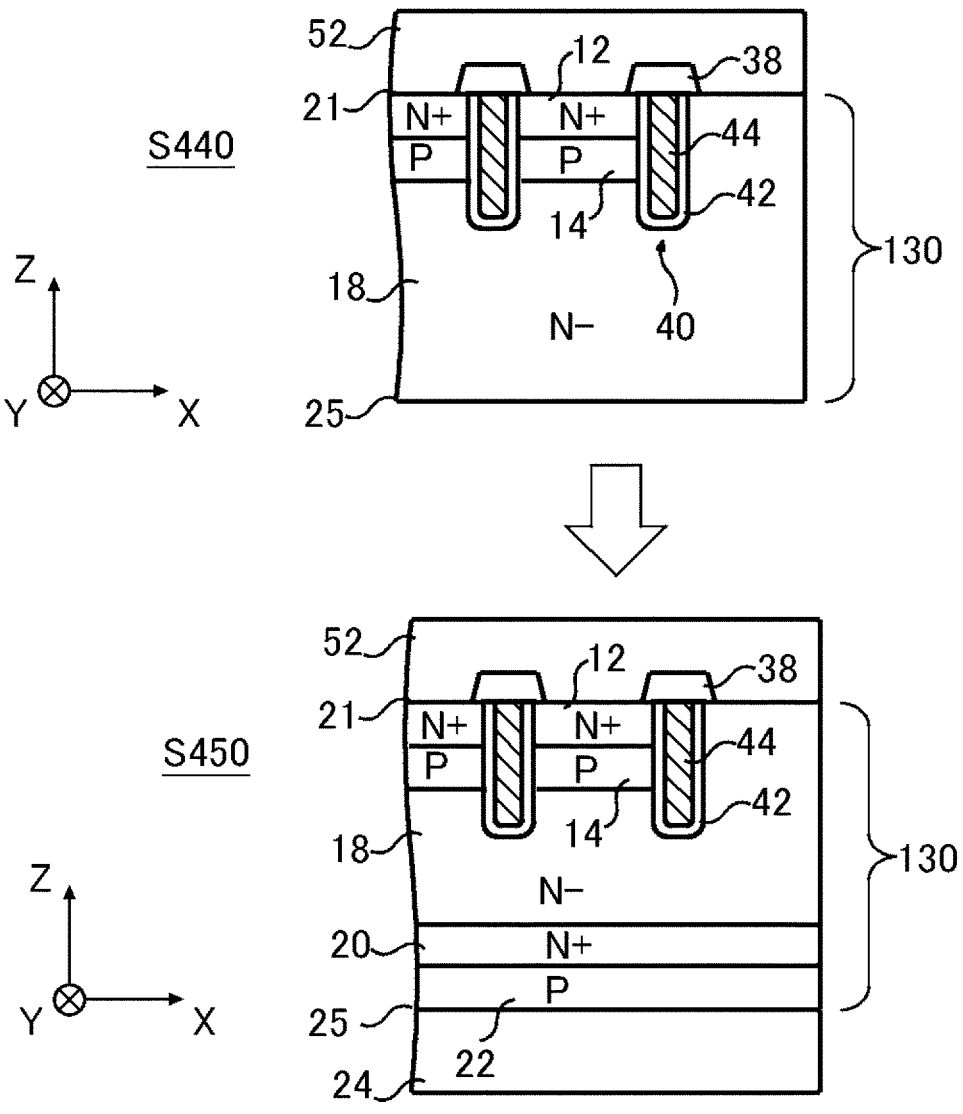
FIG. 6 illustrates a removing step S440 and a lower surface side structure forming step S450.

FIG. 6 illustrates a removing step S440 and a lower surface side structure forming step S450. In the removing step S440, regions including the lower surface 23 of the semiconductor wafer 100 are removed. In the present example, the lower surface 23 of the semiconductor wafer 100 is grinded by a method such as CMP. In the removing step S440, regions including the lower surface 23 of the semiconductor wafer 100 are removed to remove the entire impurity region 140. For example, the lower surface 23 side of the semiconductor wafer 100 is grinded at least until it reaches to an upper end of the impurity region 140. In this way, the region where the slip 120 is generated can be removed. After performing the removing step S440, the semiconductor wafer 100 includes the lower surface 25. The lower surface 25 is positioned closer to the upper surface 21 side than the lower surface 23.

In the lower surface side structure forming step S450, after the removing step S440, at least a partial structure (referred to as a lower surface side structure) of the semiconductor element is formed on the lower surface 25 side of the semiconductor wafer 100. The semiconductor element shown in FIG. 6 is an IGBT (Insulated Gate Bipolar Transistor). The lower surface side structure of the present example includes a collector region 22 and a collector electrode 24. The lower surface side structure may further include a buffer region 20. The collector region 22 is a P type region provided to contact the lower surface 25. The collector electrode 24 is an electrode provided on the lower surface 25, which includes a metal such as aluminum. By the gate voltage applied to the gate electrode 44, whether to flow current between the emitter electrode 52 and the collector electrode 24 can be controlled. The buffer region 20 is an N type region provided between the drift region 18 and the collector region 22. A donor concentration of the buffer region 20 is higher than a donor concentration of the drift region 18. The buffer region 20 functions as a field stop layer configured to suppress a depletion layer which expands from a PN junction of the base region 14 and the drift region 18 from reaching the collector region 22.

According to the example described in FIG. 5 and FIG. 6, even the manufacturing step including the annealing step S430 with the high temperature can suppress the slip 120 from reaching the element region 130. Thus, a semiconductor device with little defect can be manufactured while increasing the throughput of the manufacturing step.

Figure 7:
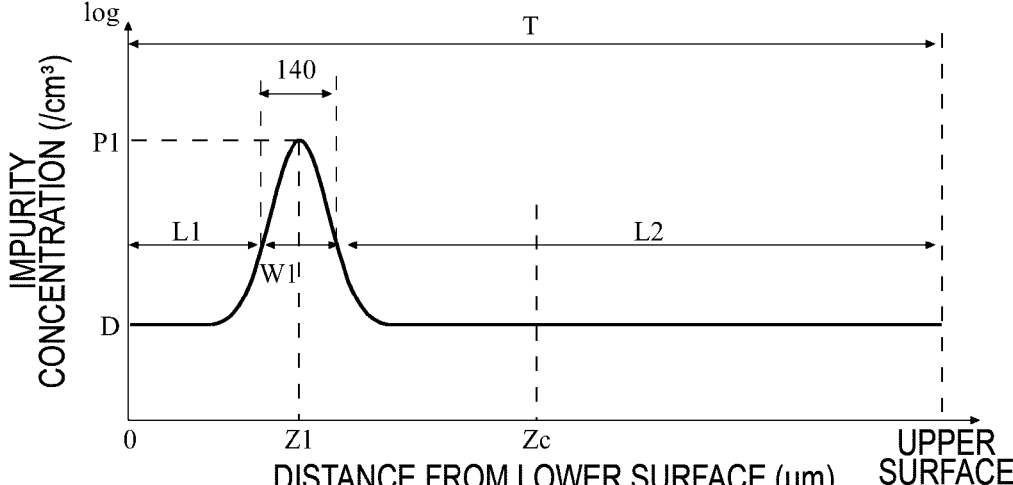
FIG. 7 shows an example of impurity concentration distribution in a depth direction of a semiconductor wafer 100.

FIG. 7 shows an example of impurity concentration distribution in a depth direction of a semiconductor wafer 100. In FIG. 7, a concentration distribution of the first impurity implanted into the impurity region 140 such as oxygen is shown, and concentrations of other impurities are not included. In addition, in FIG. 7, a concentration distribution after the annealing step S430 is shown.

A maximum value of a first impurity concentration of the impurity region 140 is referred to as P1. In the present example, the impurity region 140 is formed by implanting the first impurity such as an oxygen ion into a depth position Z1. Thus, the impurity concentration distribution shows a peak having a local maximum on the depth position Z1. A maximum value P1 of the present example is a first impurity concentration at the local maximum of the peak.

The maximum value P1 is preferred to be equal to or greater than $1\times10^{18}/cm^3$. By setting the maximum value P1 to be equal to or greater than $1\times10^{18}/cm^3$, even if the annealing temperature is equal to or greater than 1000° C., the slip 120 can be suppressed from reaching the element region 130. The maximum value P1 may be equal to or greater than $5\times10^{18}/cm^3$, or may be equal to or greater than $1\times10^{19}/cm^3$.

Note that the first impurity such as oxygen may be distributed on the entire semiconductor wafer 100. For example, when an ingot of a semiconductor is formed, the first impurity is included in the entire ingot. Since the semiconductor wafer 100 is cut out from the ingot, the first impurity may be included in the entire semiconductor wafer 100. As an example, an entire semiconductor wafer 100 cut out from an ingot formed by the MCZ method includes oxygen equal to or less than $4\times10^{17}/cm^3$. In the present example, a concentration of the first impurity distributed in the entire semiconductor wafer 100 is referred to as D. The concentration D may be an average value of the concentration of the first impurity in the entire semiconductor wafer 100. The maximum value P1 may be equal to or greater than 5 times the concentration D, may be equal to or greater than 10 times the concentration D, or may be equal to or greater than 50 times the concentration D. The concentration D of the present example is equal to or less than $4\times10^{17}/cm^3$. For a semiconductor wafer which has not an impurity region 140 formed thereon and has an average concentration of oxygen equal to or less than $4\times10^{17}/cm^3$, the slip 120 was not able to be suppressed from its proceeding.

Note that the concentration of the first impurity of the impurity region 140 may be less than $1\times10^{20}/cm^3$. That is, the maximum value P1 may be less than $1\times10^{20}/cm^3$. If the concentration of the first impurity of the impurity region 140 is too high, the first impurity may be spread to the element region 130 to affect the characteristic of the semiconductor device. The concentration of the first impurity of the impurity region 140 may be equal to or less than $5\times10^{19}/cm^3$ or may be equal to or less than $1\times10^{19}/cm^3$.

In the present example, a center position in the depth direction of the semiconductor wafer 100 is referred to as a depth position Zc. The depth position Z1 is positioned between the lower surface 23 and the depth position Zc. When the impurity is implanted by an ion implantation, the impurity concentration distribution has a peak with a local maximum nearby the depth position Z1. A range of full width at half maximum in a depth direction of the peak is referred to as a width W1 in a depth direction of the impurity region 140. The width W1 may be equal to or less than 100 μm. An effect of suppressing the development of the slip 120 can be obtained by the impurity region 140 even if it is not being formed in such a wide depth range. The width W1 may be equal to or less than 50 μm, may be equal to or less than 20 μm, or may be equal to or less than 10 μm. The width W1 may be equal to or greater than 1 μm, may be equal to or greater than 2 μm, may be equal to or greater than 5 μm. The width W1 may be equal to or less than 10% of, may be equal to or less than 5% of, or may be equal to or less than 1% of a thickness T of the semiconductor wafer 100 (a distance from the upper surface 21 to the lower surface 23).

A distance between the impurity region 140 and the lower surface 23 is referred to as L1. The distance L1 may be equal to or less than 100 μm, may be equal to or less than 50 μm, or may be equal to or less than 20 μm. The distance L1 may be 0 μm. That is, the impurity region 140 may be exposed to the lower surface 23. By reducing the distance L1, a distance in a Z direction in which the slip 120 proceeds can be reduced.

A distance between the impurity region 140 and the upper surface 21 is referred to as L2. The distance L2 may be equal to or greater than 400 μm. By keeping the distance L2, the element region 130 can be kept. The distance L2 may be equal to or greater than 200 μm. The distance L2 can be set by a thickness of the element region 130 to be formed. A distance between the element region 130 and the impurity region 140 may be equal to or greater than 0 μm, may be equal to or greater than 10 μm, or may be equal to or greater than 100 μm.

Note that the greater the thickness T of the semiconductor wafer 100 is, the greater the stress in the supported portion 102 is, and the easier the slip 120 is generated. In addition, the greater the thickness T is, the easier the slip 120 which is generated expands on the X-Y plane. In the region forming step S410, an impurity concentration P1 in the impurity region 140 may be adjusted based on the thickness T of the semiconductor wafer 100. For example, the greater the thickness T of the semiconductor wafer 100 is, the greater the impurity concentration P1 is. In this way, the development of the slip 120 can be more likely to be suppressed. In addition, in the region forming step S410, a range in which the impurity region 140 is formed on the X-Y plane may be adjusted based on the thickness T of the semiconductor wafer 100. For example, the greater the thickness T of the semiconductor wafer 100 is, the greater the range in which the impurity region 140 is formed is. In this way, the slip 120 which proceeds in the Z axis direction while expanding in the X-Y plane is likely to be inhibited by the impurity region 140. The magnitude of the impurity region 140 on the X-Y plane may be adjusted based on a distance of the impurity region 140 from the lower surface 23. For example, the greater the distance from the lower surface 23 is, the greater the area of the impurity region 140 to be formed may be. In this way, the slip 120 which proceeds in the Z axis direction while expanding in the X-Y plane is likely to be inhibited by the impurity region 140.

In addition, a possibility of the slip 120 to be generated and developed may vary according to an oxygen concentration D of the entire semiconductor wafer 100. In the region forming step S410, an impurity concentration P1 in the impurity region 140 may be adjusted based on the oxygen concentration D of the entire semiconductor wafer 100. For example, the lower the oxygen concentration D is, the lower the impurity concentration P1 is. The impurity concentration P1 can be adjusted by a dose amount of the first impurity to be implanted. In this way, an excessive implanting of the first impurity can be suppressed while the slip 120 is suppressed from being developed. In addition, in the region forming step S410, a range in which the impurity region 140 is formed on the X-Y plane may be adjusted based on the oxygen concentration D of the entire semiconductor wafer 100. For example, the greater the oxygen concentration D is, the greater the range in which the impurity region 140 is formed is. In this way, an excessive implanting of the first impurity can be suppressed while the slip 120 is suppressed from being developed.

Figure 8:
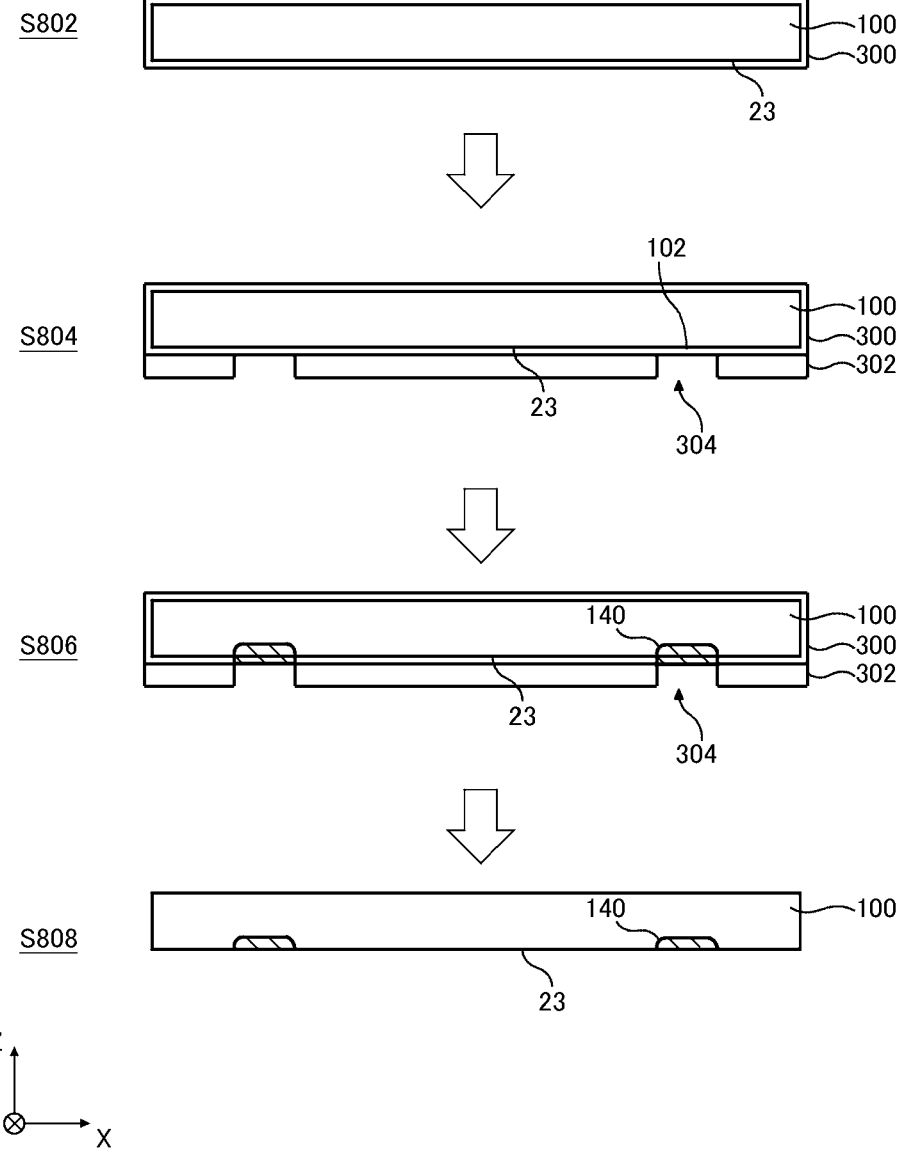
FIG. 8 illustrates an example of processing in the region forming step S410.

FIG. 8 illustrates an example of processing in the region forming step S410. The region forming step S410 in the present example includes an oxide film forming step S802, a resist film forming step S804, an impurity implantation step S806, and a film removing step S808.

In the oxide film forming step S802, an oxide film 300 is formed on at least the lower surface 23 of the semiconductor wafer 100. The oxide film 300 covers the entire lower surface 23. In the present example, the oxide film 300 is formed on the entire surface of the semiconductor wafer 100. In the oxide film forming step S802 in the present example, the semiconductor wafer 100 is put into a diffusion furnace to thermally oxidize the entire surface of the semiconductor wafer 100 to form the oxide film 300.

Subsequently, in the resist film forming step S804, a resist film 302 is formed on the oxide film 300. The resist film 302 is stacked on the oxide film 300 formed on the lower surface 23 of the semiconductor wafer 100. In the resist film forming step S804, an aperture 304 is formed on the resist film 302 which is at a position corresponding to the supported portion 102. The aperture 304 is overlapped with the entire supported portion 102 on the X-Y plane. In the resist film forming step S804, the aperture 304 may be formed by photolithography. Note that the aperture 304 may not expose the lower surface 23 of the semiconductor wafer 100. That is, in the resist film forming step S804, the aperture 304 may be formed such that the oxide film 300 is maintained.

Subsequently, in the impurity implantation step S806, the first impurity is implanted from the aperture 304 to form the impurity region 140. In the impurity implantation step S806, a depth position Z1 may be set for implanting the impurity into the oxide film 300 (see FIG. 7), a depth position Z1 may be set for implanting the impurity into a boundary between the oxide film 300 and the lower surface 23 of the semiconductor wafer 100, and a depth position Z1 may be set for implanting the impurity into the semiconductor wafer 100. In the impurity implantation step S806 in the present example, the impurity region 140 is formed in a region including the lower surface 23 of the semiconductor wafer 100. A part of the impurity region 140 may be formed in the oxide film 300.

Subsequently, in the film removing step S808, the resist film 302 and the oxide film 300 are removed. By such a process, the impurity region 140 can be formed on the semiconductor wafer 100. The impurity region 140 in the present example is exposed to the lower surface 23 of the semiconductor wafer 100. The impurity region 140 may be exposed to the lower surface 23 of the semiconductor wafer 100 by spreading the first impurity by the annealing step S430. In addition, by providing the oxide film 300, the semiconductor wafer 100 can be protected in a process of forming the impurity region 140. In addition, by implanting the first impurity via the oxide film 300, implanting accuracy of the first impurity is likely to be maintained even if dirt or the like is attached to the lower surface 23 of the semiconductor wafer 100.

In the impurity implantation step S806 in the present example, acceleration energy of the first impurity ion may be adjusted according to a film thickness of the oxide film 300. For example, the greater the film thickness of the oxide film 300 is, the greater the acceleration energy of the first impurity ion is. In this way, the first impurity can be implanted into the semiconductor wafer 100 which is covered with the oxide film 300 while the semiconductor wafer 100 is protected by the oxide film 300.

Figure 9:
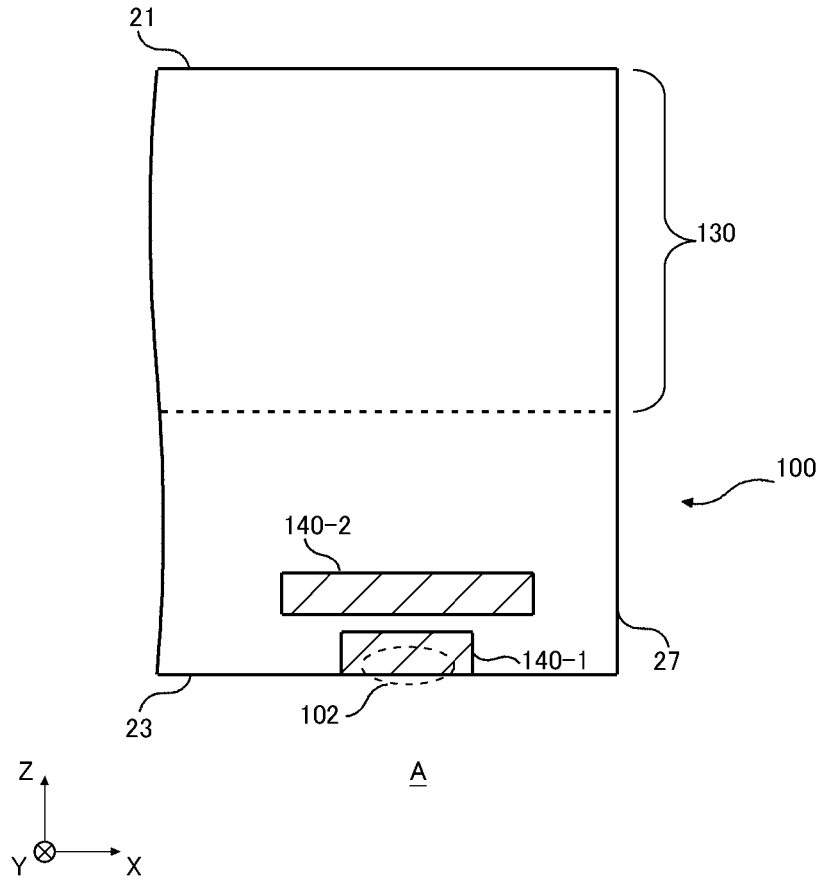
FIG. 9 illustrates another configuration example of an impurity region 140.

FIG. 9 illustrates another configuration example of an impurity region 140. In FIG. 9, an area nearby the region A is shown. In the region forming step S410 in the present example, the impurity region 140 is formed at a plurality of positions in the thickness direction (Z axis direction) of the semiconductor wafer 100. Other structures are similar to any of the examples described in FIG. 3 to FIG. 8. In FIG. 9, an example of forming an impurity region 140-1 and an impurity region 140-2 is shown, but three or more impurity regions 140 may be formed. A depth position in which the impurity region 140 is formed can be controlled by acceleration energy of the first impurity ion.

According to the present example, the width W1 of the impurity region 140 in the Z axis direction is likely to be kept. Also, in addition to the effect of suppressing the development of the slip 120, the impurity region 140 may also provide a gettering effect of capturing a nearby unnecessary component to combine it with the first impurity. By keeping the width W1, the gettering effect can be improved. The gettering effect is an effect of capturing and fixing the impurity which is present within the semiconductor wafer 100 and which causes a metal contamination or the like.

For example, depending on the type of impurity or acceleration energy of impurity ions, a case where a full width at half maximum of one concentration peak is small may be considered. In this case, the width W1 of the impurity region 140 also can be kept by implanting a first impurity ion to the plurality of depth positions. A concentration peak of the first impurity which is implanted to each of the depth positions may be overlapped with each other or may be apart from each other. The concentration peaks being apart from each other means that a concentration of a valley portion between two local maximums is less than half of a concentration at the local maximum. The concentration of the first impurity in each of the depth positions may be the same or may be different from each other. In addition, to each of the depth positions, the first impurity of the same element may be implanted or the first impurity of the different element may be implanted. For example, oxygen may be implanted to each of the depth positions, or oxygen may be implanted to any of the depth positions and nitrogen may be implanted to any other of the depth positions. By implanting first impurities of different elements, the gettering effect can be obtained for various components.

In addition, in the region forming step S410, the greater a distance of the impurity region 140 from the lower surface 23 of the semiconductor wafer 100 in the Z axis direction, the wider a range in which the impurity region 140 may be formed on the X-Y plane (that is, in a top view). In the example of FIG. 9, the impurity region 140-2 having a large distance from the lower surface 23 is formed in a wider range than the impurity region 140-1 having a small distance from the lower surface 23. The more apart the slip 120 is from the lower surface 23 in the Z axis direction, the easier the slip 120 generated in the supported portion 102 (see FIG. 3) expands in an X-Y direction. By forming the impurity region 140 near the lower surface 23 to be small, the dose amount of the first impurity can be reduced while the slip 120 is suppressed from being developed. Thus, warpage of the semiconductor wafer 100 can be prevented.

The impurity region 140-1 may be exposed to the lower surface 23. In the X-Y plane, an area of the impurity region 140-2 may be 1.2 times or more, or may be 1.5 times or more, or may be twice or more of that of the impurity region 140-1.

Figure 10:
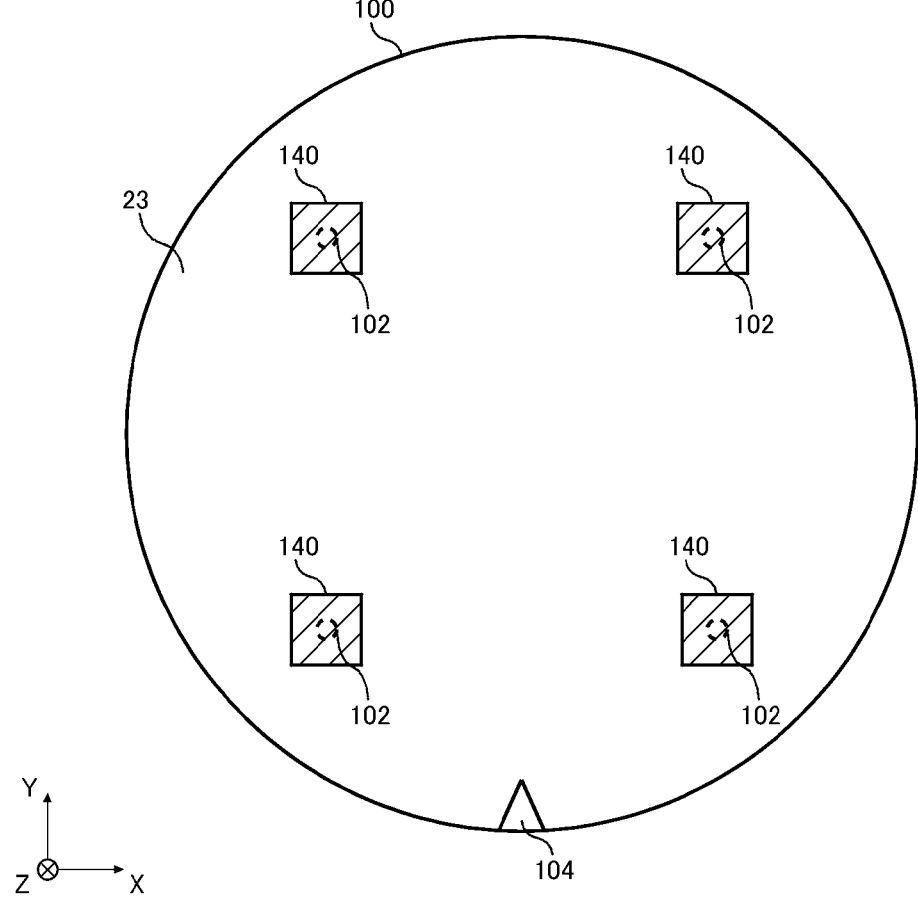
FIG. 10 illustrates an exemplary arrangement of a supported portion 102 and an impurity region 140 on a lower surface 23.

FIG. 10 illustrates an exemplary arrangement of a supported portion 102 and an impurity region 140 on a lower surface 23. Note that the impurity region 140 may be exposed or may not be exposed to the lower surface 23. In FIG. 10, a position in which the impurity region 140 is projected on the lower surface 23 is shown.

The semiconductor wafer 100 in the present example has a plurality of supported portions 102 supported by a plurality of supporting portions 110 (see FIG. 3) in the annealing step S430 or the like. In the region forming step S410, an impurity region 140 is formed for each of the supported portions 102. As shown in FIG. 10, each impurity region 140 is formed to cover the entire corresponding supported portion 102. In addition, each of the impurity regions 140 is arranged to be apart from each other.

The semiconductor wafer 100 may have a reference point 104 for positioning. The reference point 104 may be a notch (cutout) provided on the edge of the semiconductor wafer 100. Note that the reference point 104 is not limited to the notch. The reference point 104 may be anything as long as it can be detected from an image of the semiconductor wafer 100.

The manufacturing method may include a reference detection step for detecting the reference point 104. In the reference detection step, the reference point 104 is detected from the image of the semiconductor wafer 100. In the region forming step S410, a position in which the impurity region 140 is to be formed may be controlled based on a position of the reference point 104. A relative position of the supported portion 102 relative to the reference point 104 is preferred to be preset on a manufacturing apparatus or the like.

The impurity region 140 may be in a rectangular shape on the X-Y plane. The impurity region 140 may be formed by using an open frame exposure, for example. In the open frame exposure, a resist film is exposed to a predetermined pattern without forming a mask on the resist film which is applied on the semiconductor wafer 100. In addition, for example, the shape of light may be formed by using a reticle having a pattern transmitting the light formed thereto, and the resist film may be exposed. The impurity region 140 is formed by implanting the first impurity via the aperture formed on the resist film.

Figure 11:
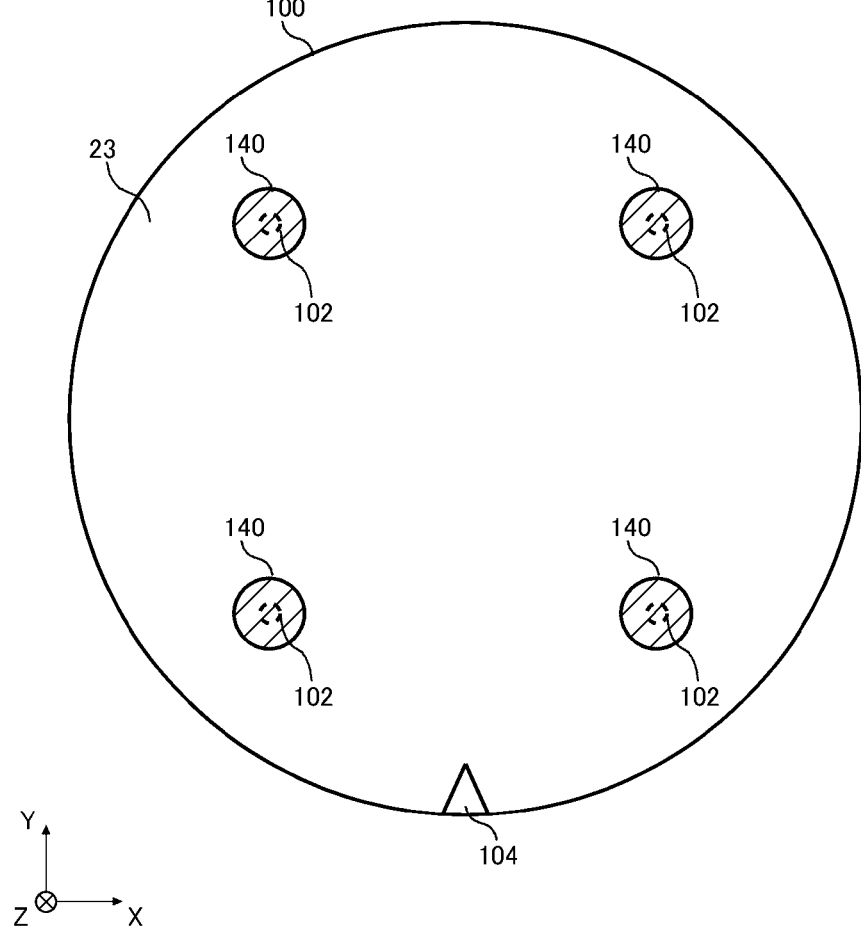
FIG. 11 illustrates another example of a shape of the impurity region 140.

FIG. 11 illustrates another example of a shape of the impurity region 140. The impurity region 140 in the present example has a circular shape on the X-Y plane. The impurity region 140 may be formed by using a resist mask, for example. That is, the resist film may be exposed by forming a mask of a predetermined pattern on the resist film which is applied on the semiconductor wafer 100.

Figure 12:
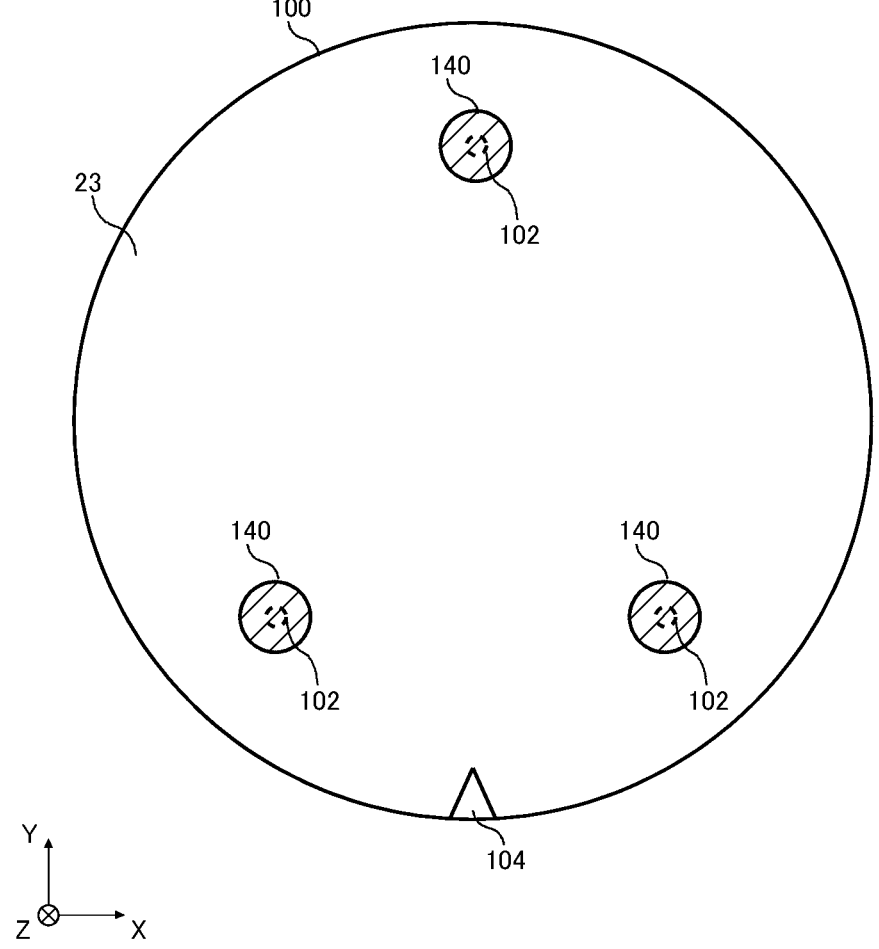
FIG. 12 illustrates another exemplary arrangement of the supported portion 102 and the impurity region 140 on the lower surface 23.

FIG. 12 illustrates another exemplary arrangement of the supported portion 102 and the impurity region 140 on the lower surface 23. While there are four supported portions 102 and four impurity regions 140 arranged in FIG. 10 and FIG. 11, there are three supported portions 102 and three impurity regions 140 arranged on the semiconductor wafer 100 in the present example.

In the region forming step S410, at least one of a range in which the impurity region 140 is to be formed or the impurity concentration in the impurity region 140 may be controlled based on a number of the supported portions 102 on the lower surface 23. According to the number of the supported portions 102, the weight of the semiconductor wafer 100 added to each one of the supported portions 102 varies. Thus, a possibility of the slip 120 to be generated in each one of the supported portions 102 or a possibility of the slip 120 to be developed may vary according to the number of the supported portions 102. By controlling the magnitude or the impurity concentration of the impurity region 140 according to the number of the supported portions 102, an impurity region 140 having a suitable magnitude and impurity concentration can be formed. In the region forming step S410, the less the number of the supported portions 102 is, the bigger each of the impurity regions 140 is, or the higher the impurity concentration may be.

Figure 13:
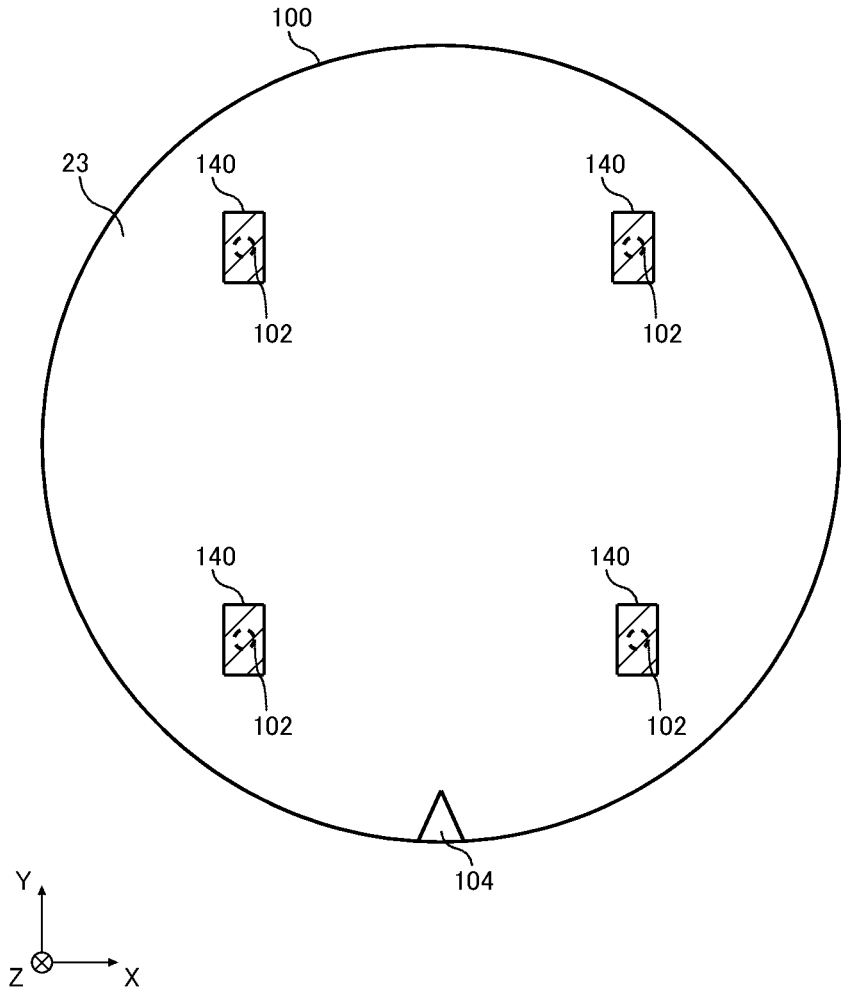
FIG. 13 illustrates another example of a shape of the impurity region 140.

FIG. 13 illustrates another example of a shape of the impurity region 140. In the examples of FIG. 10 to FIG. 12, the shape of the impurity region 140 on the X-Y plane is regular polygon or perfectly circular. The impurity region 140 in the present example may have a longitudinal length (or a longitudinal axis) in any direction of the X-Y plane. For example, the impurity region 140 has a rectangular shape.

When a direction in which the slip 120 is likely to proceed on the X-Y plane exists, in the region forming step S410, an impurity region 140 having a longitudinal length in the direction may be formed. The direction in which the slip 120 is likely to proceed may be detected from past manufacture performance or the like, or may be estimated from another condition. For example, according to a crystal orientation, the direction in which the slip 120 is likely to proceed may be different. In the region forming step S410, the shape of the impurity region 140 may be controlled based on the crystal orientation of the semiconductor wafer 100.

In addition, when there are a plurality of directions in which the slip 120 is likely to proceed, the impurity region 140 may have longitudinal lengths in the plurality of directions of the X-Y plane. For example, the impurity region 140 may have a cruciform shape (that is, two rectangular shapes orthogonal to each other) in the X-Y plane. When the semiconductor wafer 100 is a silicon wafer having a crystal surface orientation (100), the impurity region 140 may have a cruciform shape having a longitudinal length in two directions of the crystal orientations (001) and (010) orthogonal to each other.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor device manufacturing method including a process of annealing a semiconductor wafer in a state in which a supported portion on a lower surface of the semiconductor wafer is supported by using a supporting portion, wherein the supported portion includes one or a plurality of supported portions and the supporting portion includes one or a plurality of supporting portions, the method comprising:

forming a plurality of separately isolated slip-suppressing impurity regions isolated to separate regions each corresponding to the one or the plurality of supporting portions, each of the plurality of separately isolated slip-suppressing impurity regions including a first impurity at a common depth embedded within the lower surface of the semiconductor wafer, the plurality of separately isolated slip-suppressing impurity regions being apart from one another, being overlapped with the one or the plurality of supported portions in a top view, with no slip-suppressing impurity being within at least 10 mm from an edge of the semiconductor wafer;

annealing the semiconductor wafer in a state in which the lower surface of the semiconductor wafer is supported by the one or the plurality of supporting portions;

removing the semiconductor wafer from the one or the plurality of supporting portions; and removing the one or the plurality of separately isolated slip-suppressing impurity regions by removing the lower surface of the semiconductor wafer which includes the one or the plurality of separately isolated slip-suppressing impurity regions.

2. The semiconductor device manufacturing method according to claim 1, wherein in the annealing, the one or the plurality of supported portions are supported by the one or the plurality of supporting portions, and in the forming, one or more of the one or the plurality of separately isolated slip-suppressing impurity regions are formed for each of the one or the plurality of supported portions.

3. The semiconductor device manufacturing method according to claim 1, wherein the one or the plurality of separately isolated slip-suppressing impurity regions formed in the forming is exposed to the lower surface of the semiconductor wafer.

4. The semiconductor device manufacturing method according to claim 1, further comprising detecting a reference point in the semiconductor wafer, wherein in the forming, a position in which the one or the plurality of separately isolated slip-suppressing impurity regions are to be formed is controlled based on a position of the reference point.

5. The semiconductor device manufacturing method according to claim 1, wherein in the forming, at least one of a range in which the one or the plurality of separately isolated slip-suppressing impurity regions is to be formed or an impurity concentration in the one or the plurality of separately isolated slip-suppressing impurity regions is controlled based on a thickness of the semiconductor wafer.

6. The semiconductor device manufacturing method according to claim 1, wherein in the forming, at least one of a range in which the one or the plurality of separately isolated slip-suppressing impurity regions is to be formed or an impurity concentration in the one or the plurality of separately isolated slip-suppressing impurity regions is controlled based on an oxygen concentration of the semiconductor wafer.

7. The semiconductor device manufacturing method according to claim 1, wherein in the forming, at least one of a range in which the one or the plurality of separately isolated slip-suppressing impurity regions is to be formed or an impurity concentration in the one or the plurality of separately isolated slip-suppressing impurity regions is controlled based on a number of the one or the plurality of supported portions.

8. The semiconductor device manufacturing method according to claim 1, wherein in the forming, a shape of a range in which the one or the plurality of separately isolated slip-suppressing impurity regions is to be formed is controlled based on a crystal orientation of the semiconductor wafer.

9. The semiconductor device manufacturing method according to claim 1, wherein in the forming, the one or the plurality of separately isolated slip-suppressing impurity regions is formed at a plurality of positions in a thickness direction of the semiconductor wafer.

10. The semiconductor device manufacturing method according to claim 9, wherein in the forming, when a distance of the one or the plurality of separately isolated slip-suppressing impurity regions from the lower surface of the semiconductor wafer is greater, a range in which the one or the plurality of separately isolated slip-suppressing impurity regions is to be formed becomes wider in a top view.

11. The semiconductor device manufacturing method according to claim 1, wherein the first impurity is oxygen.

12. The semiconductor device manufacturing method according to claim 1, wherein after the annealing, a maximum value of a concentration of the first impurity in the one or the plurality of separately isolated slip-suppressing impurity regions is equal to or greater than $1 \times 10^{18}/cm^3$.

13. The semiconductor device manufacturing method according to claim 12, wherein after the annealing, a concentration of the first impurity in the one or the plurality of separately isolated slip-suppressing impurity regions is less than $1 \times 10^{20}/cm^3$.

14. The semiconductor device manufacturing method according to claim 1, wherein in the forming, the first impurity is implanted from the lower surface of the semiconductor wafer.

15. The semiconductor device manufacturing method according to claim 1, wherein after the annealing, a width of the one or the plurality of separately isolated slip-suppressing impurity regions in a depth direction is equal to or less than 100 μm.

16. The semiconductor device manufacturing method according to claim 1, wherein in the annealing, the semiconductor wafer is heated at a temperature equal to or greater than 1000° C.

17. The semiconductor device manufacturing method according to claim 1, wherein the one or the plurality of separately isolated slip-suppressing impurity regions is apart from an upper surface of the semiconductor wafer by equal to or greater than 400 μm.

18. The semiconductor device manufacturing method according to claim 1, wherein in the forming, an oxide film is formed on the lower surface of the semiconductor wafer, a resist film is formed on the oxide film, an aperture is formed on the resist film at a position corresponding to the one or the plurality of supported portions, the first impurity is implanted from the aperture, and the resist film and the oxide film are removed.

19. The semiconductor device manufacturing method according to claim 2, wherein the one or the plurality of separately isolated slip-suppressing impurity regions formed in the forming are exposed to the lower surface of the semiconductor wafer.

20. The semiconductor device manufacturing method according to claim 2, further comprising
detecting a reference point in the semiconductor wafer, wherein
in the forming, a position in which the one or the plurality of separately isolated slip-suppressing impurity regions is to be formed is controlled based on a position of the reference point.

21. The semiconductor device manufacturing method according to claim 1, further comprising:
temporarily supporting only a perimeter region and not a central region of the lower surface of the semiconductor wafer at a point, line or surface separated from an edge of the semiconductor wafer by at least 10 mm.

* * * * *